US008502354B2

(12) United States Patent
Togashi

(10) Patent No.: US 8,502,354 B2
(45) Date of Patent: Aug. 6, 2013

(54) BREAK PATTERN OF SILICON WAFER, SILICON WAFER, AND SILICON SUBSTRATE

(75) Inventor: Isamu Togashi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/570,753

(22) Filed: Aug. 9, 2012

(65) Prior Publication Data

US 2013/0037916 A1 Feb. 14, 2013

(30) Foreign Application Priority Data

Aug. 12, 2011 (JP) ................................ 2011-176522

(51) Int. Cl.
*H01L 23/544* (2006.01)

(52) U.S. Cl.
USPC ............................ 257/628; 257/620; 257/627

(58) Field of Classification Search
USPC ........................... 257/620, 627–628, E23.179
See application file for complete search history.

(56) References Cited

FOREIGN PATENT DOCUMENTS

JP 2006-175668 7/2006

*Primary Examiner* — Tran Tran
(74) *Attorney, Agent, or Firm* — Workman Nydegger

(57) ABSTRACT

A break pattern of a silicon wafer includes a line to be cut which is set in the silicon wafer assuming a surface as a (110) face in a surface direction of a first (111) face perpendicular to the (110) face; and through holes which are provided in a plurality of rows on the line to be cut, wherein each of the through holes has a first (111) face, a second (111) face which intersects the first (111) face, and a third (111) face which intersects the second (111) face and the first (111) face, an intersecting point with end edges of the second (111) face and the third (111) face is assumed as a point closest to the adjacent through holes.

6 Claims, 8 Drawing Sheets

BREAK PATTERN OF SILICON WAFER, SILICON WAFER, AND SILICON SUBSTRATE

BACKGROUND

1. Technical Field

The present invention relates to a break pattern which is formed by etching on a line to be cut of a silicon wafer having crystalline properties, a silicon wafer and a silicon substrate.

2. Related Art

As a liquid ejecting head which ejects liquid droplets from a nozzle opening by causing a pressure of liquid in a pressure chamber to change, there are, for example, an ink jet type recording head (hereinafter, simply referred to as a recording head) used for an image recording apparatus such as a printer, a color material ejecting head used for production of a color filter such as for a liquid crystal display, an electrode material ejecting head used for formation of an electrode of an organic EL (electroluminescent) display, a FED (surface-emitting display) or the like, and a bio-organic matter ejecting head used for production of a biochip (biological and chemical element).

When giving as an example a case of the recording head mentioned above, the head is provided with a nozzle forming member that has a plurality of nozzle openings, a passage forming member that forms a liquid passage including a pressure chamber communicating with the nozzle openings, an actuator unit that includes a pressure generating device for generating a pressure change to the liquid in the pressure chamber, and the like. As for these constituent members, particularly the passage forming member, in order to respond to a densification of the recorded image and speedup of the recording operation, an improvement of processing density and processing precision is required. Therefore, as materials for the passage forming member, a base material having a crystalline property such as silicon being able to form a minute shape with good dimensional precision is preferably used.

In a case where the passage forming member is formed using silicon as a base material, for example, a plurality of regions for the passage forming member are formed by dividing a substantially circular silicon wafer, and a portion to be the liquid passage for each region is formed by etching. In addition, a plurality of small through holes is drilled on a line to be cut by the same etching and a break pattern is formed. In this break pattern, a portion between the through holes adjacent to each other becomes weak, and this portion is broken by applying an external force and is divided into multiple portions. Thereby, it is possible to obtain a plurality of passage forming members from one silicon wafer.

According to the above-mentioned break pattern, in the silicon wafer assuming a surface as a (110) face, there is a case that a residual portion which consists of a (111) face slanted with respect to the surface of the silicon wafer is intentionally left at a portion in each through hole (for example, see JP-A-2006-175668). Thereby preventing a malfunction caused when the break pattern is broken carelessly.

However, it is difficult to manage the shape of the residual portion as described above and also its size varies easily due to variation of the etching (variation of etching time). If the size of this residual portion varies, the strength of the fragile portion which is formed between the adjacent through holes varies and there is a possibility that the line to be cut cannot be cut stably. In other words, there is a possibility that, for example, an unintended portion is cleaved, or debris of the residual portion might be scattered. In addition, in order to be more stably cut on the line to be cut, as shown in FIG. 8A, there is a break pattern such that through holes 84 are formed in the shape of a parallelogram by a first (111) face 82 and a second (111) face 83 which are perpendicular to a (110) face which is a surface 81 of the silicon wafer, and acute angle portions of each through hole 84 are opposed to at the adjacent through holes 84. In this case, a space between the acute angle portions of the adjacent through holes becomes a line to be cut. However, the internal side of each acute angle portion is difficult to etch, and a third (111) face inclined with respect to the surface 81 of the silicon wafer is easily left as a residual portion 85 due to etching variations (see FIG. 8B). If these residual portions 85 remain, not only is there a fear of being cut in a line different from the line to be cut (for example, the dashed line in FIG. 8B), but also there is a possibility that the cutting is not performed or debris is scattered.

SUMMARY

An advantage of some aspects of the invention is to provide a break pattern of a silicon wafer which can be cut stably regardless of variations in etching, a silicon wafer and a silicon substrate.

According to an aspect of the invention, there is provided a break pattern of a silicon wafer including a line to be cut which is set on a (110) face in the silicon wafer assuming a surface as the (110) face in a surface direction of a first (111) face perpendicular to the (110) face; and through holes which are penetrated in the thickness direction of the silicon wafer and are provided in a plurality of rows on the line to be cut. Herein, each of the through holes has a first (111) face, a second (111) face which intersects the first (111) face and is perpendicular to the (110) face, and a third (111) face which intersects the second (111) face and the first (111) face and is slanted with respect to the (110) face. An intersecting point with end edges of the second (111) face and the third (111) face is assumed as a point closest to the adjacent through holes. A position of the intersecting point in a direction perpendicular to the first (111) face is set between the first (111) face and another first (111) face relative to a side close to the intersecting point of the adjacent through holes.

In the break pattern of a silicon wafer according to the aspect of the invention, since the through holes are arranged adjacent to each other on an imaginary line along the line to be cut from the intersecting point between the end edges of the second (111) face and the third (111) face, it is possible to be cut along the line to be cut. In addition, even though the etching varies, it is possible to be cut along the line to be cut and thereby, to cut the substrate stably.

In addition, the line to be cut means an imaginary line that indicates a cutting position (an assumed cutting position) which is a target when dividing the silicon wafer into individual portions and has a predetermined width in a range with respect to a direction perpendicular to the first (111) face.

In the above configuration, it is preferable that the intersecting point is opposed to the second (111) face of a side close to the intersecting point of the adjacent through holes.

In the break pattern of a silicon wafer according to the aspect of the invention, since the position of line to be cut can be narrowed down to in a position passing through the second (111) face, it is possible to be cut more accurately. Thus, it is possible to be cut the substrate more stably.

According to another aspect of the invention, there is provided a silicon wafer including the break pattern formed according to any one of the above configurations.

According to still another aspect of the invention, there is provided a silicon substrate including the break pattern according to any one of the above configurations which is formed on the silicon wafer by etching, wherein the silicon wafer is cut in the break pattern by an expanding break which radially pulls and expands from the center of the silicon wafer.

BRIEF DESCRIPTION OF THE DRAWINGS

The invention will be described with reference to the accompanying drawings, wherein like numbers reference like elements.

FIGS. 4A and 4B are diagrams for explaining a configuration of a break pattern formed on a line to be cut transversely in the silicon wafer, wherein FIG. 4A is an enlarged view of a portion of the break pattern when etching time is relatively long, and FIG. 4B is an enlarged view of a portion of the break pattern when etching time is relatively short.

FIGS. 8A and 8B are diagrams for explaining the configuration of the break pattern formed on a line to be cut transversely in a conventional silicon wafer, wherein FIG. 8A is an enlarged view of a portion of the break pattern when etching time is relatively long, and FIG. 8B is an enlarged view of a portion of the break pattern when etching time is relatively short.

DESCRIPTION OF EXEMPLARY EMBODIMENTS

Herein below, embodiments for carrying out the invention will be described with reference to the accompanying drawings. In addition, in the embodiments described below, there have been a variety limitation as preferred embodiment of the invention, but the scope of the invention is not limited thereto as long as there is no description of the effect that limits the invention in particular to these embodiments in the following description. In addition, as a liquid ejecting apparatus of the invention, an ink jet recording apparatus (hereinafter, referred to as a printer) is described as an example in the following.

Figure 1:
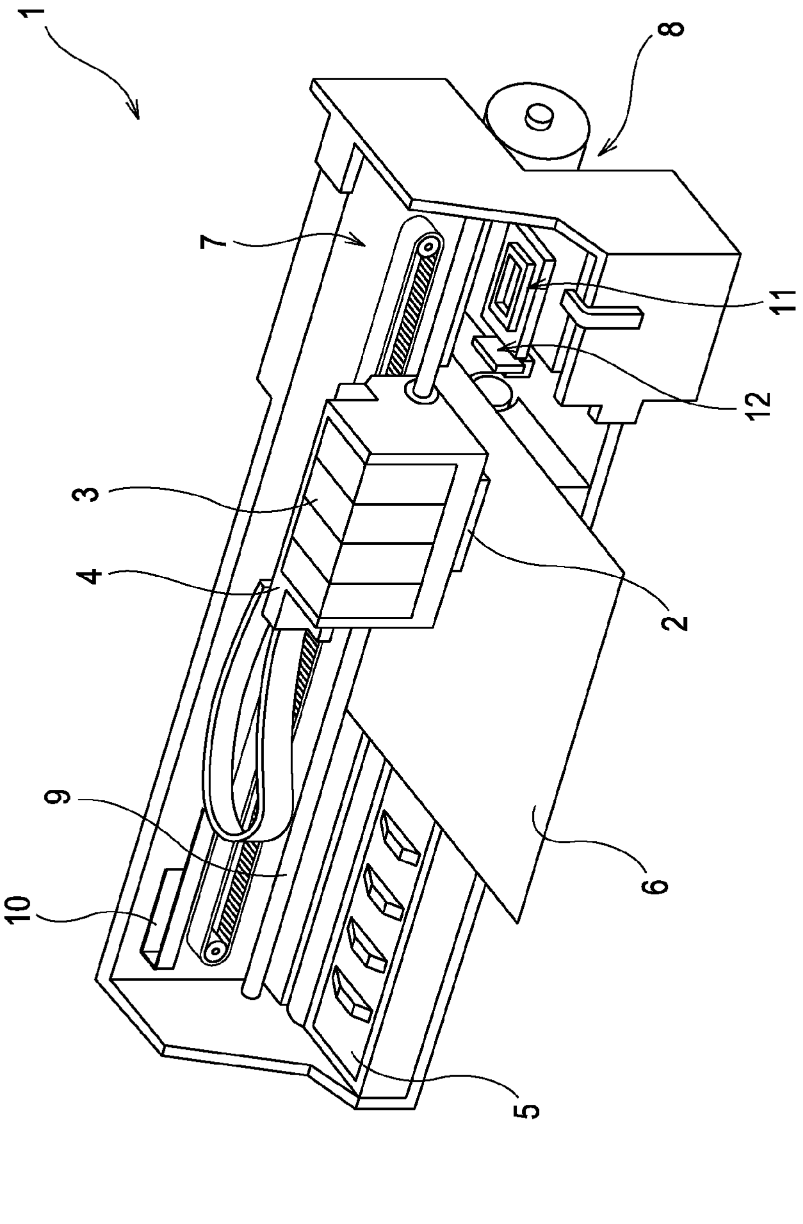
FIG. 1 is a perspective view of a printer.

FIG. 1 shows a perspective view showing a configuration of a printer 1. This printer 1 is provided with a carriage 4 to which a recording head 2, which is a kind of liquid ejecting head, is attached and an ink cartridge 3, which is a kind of liquid supply source, is attached detachably, a platen 5 that is arranged below the recording head 2 when performing the recording operation, a carriage moving mechanism 7 that reciprocates the carriage 4 in paper width direction of a recording paper 6 (a kind of a recording medium and a target landed), that is, in a main scanning direction, and a transport mechanism 8 that transports the recording paper 6 in the sub-scanning direction perpendicular to the main scanning direction.

The carriage 4 is mounted in a state of being pivotally supported on a guide rod 9 in a main scanning direction and moves in the main scanning direction along the guide rod 9 by the operation of a carriage moving mechanism 7. A position of the carriage 4 in the main scanning direction is detected by a linear encoder 10, which is a kind of position information detection means, and transmits the detected signal, that is, an encoder pulse (a kind of position information) to a control unit of the printer 1.

In addition, a home position which becomes a starting point for scanning of carriage 4 is set in an outer end region than a recording area within the range of movement of the carriage 4. In the embodiment, a capping member 11 for sealing a nozzle forming surface of the recording head 2 (see FIG. 2: nozzle plate 25) and a wiper member 12 for wiping the nozzle form surface are disposed at the home position. The printer 1 performs so-called bi-directional record that records information such as text and images on the recording paper 6 in both directions when reciprocating such that the carriage 4 is moved toward the opposite side end from the home position side and the carriage 4 is returned to the home position side from the opposite side end.

Figure 2:
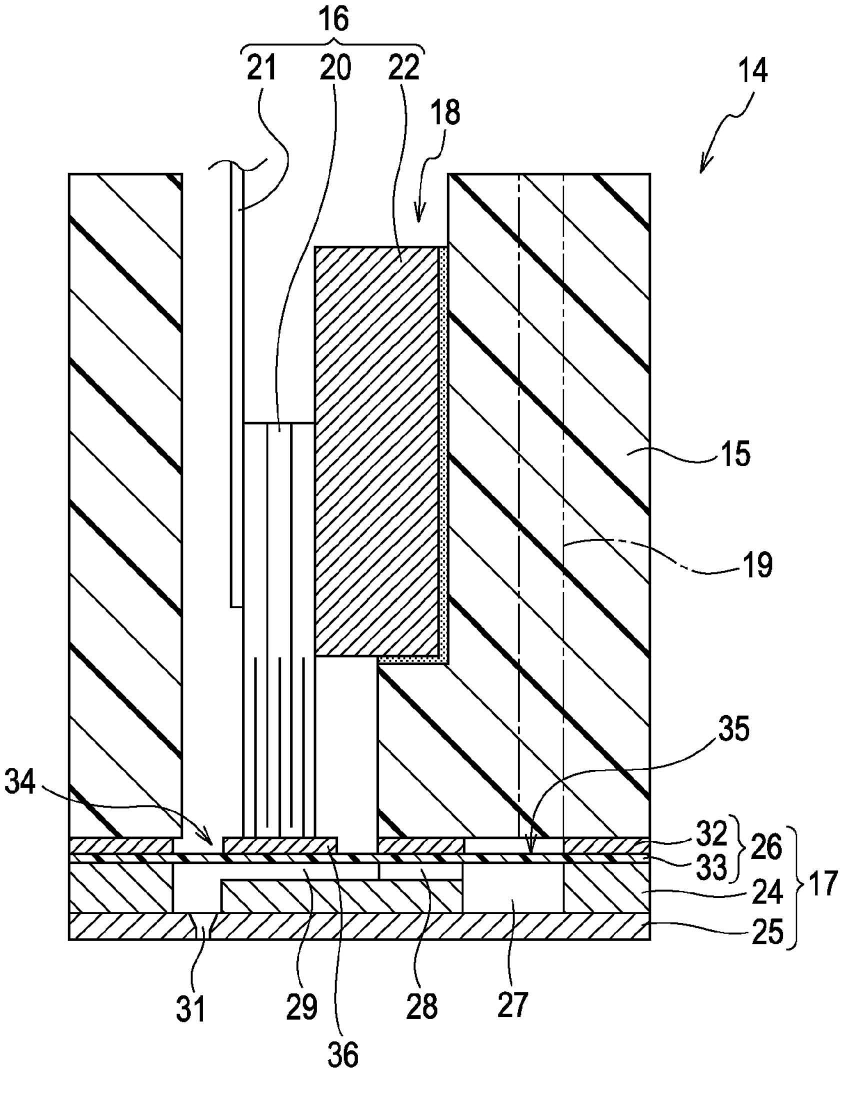
FIG. 2 is a cross-sectional view illustrating a main portion of the configuration of a recording head.

The recording head 2, as shown in FIG. 2, is composed of a head case 15, a vibrator unit 16 and a passage unit 17. The head case 15 is, for example, a hollow box member made of by an epoxy resin, and the passage unit 17 is fixed to the distal end surface (lower surface) of the head case 15 and the vibrator unit 16 is housed in an empty portion 18 that is formed inside the case. In addition, a case passage 19 is formed inside the head case 15 to be penetrated in the height direction thereof. This case passage 19 is a passage for supplying ink from the ink cartridge 3 to a reservoir 27 to be described later.

The vibrator unit 16 is constituted with a plurality of piezoelectric vibrators 20 which are installed in the comb-shaped rows, a flexible cable 21 (wiring member) for supplying a driving signal from the driving substrate to the piezoelectric vibrators 20, and a fixing plate 22 for fixing one side end of the piezoelectric vibrator 20. The distal end surface of the free end portion which is not fixed to the fixing plate 22 of the piezoelectric vibrator 20 is joined to an island portion 36 (vibrating plate 26) to be described later. This piezoelectric vibrator 20 can eject ink from the nozzle 31 under the control of this pressure change, since the piezoelectric vibrator stretches and shrinks by applying of the drive signal to expand or contract the volume of a pressure chamber 29 described later and causes variations in pressure to the ink in the pressure chamber 29.

The flow passage unit 17 is constituted by joining each of a nozzle plate 25 on one side surface of a passage forming the substrate 24 and the vibrating plate 26 to the other side surface of the passage forming substrate 24. This passage unit 17 is provided with a reservoir 27 (common liquid chamber) that communicates with a case passage 19, an ink supply port 28 that is formed as a stenosis in which the passage width is narrow, the pressure chamber 29 that communicates with the reservoir 27 via an ink supply port 28, and a nozzle 31 that is opened to the pressure chamber 29. In this embodiment, the passage forming substrate 24 is fabricated by etching the silicon wafer 38 which is a base material having a crystalline properties.

The above nozzle plate 25 is a thin plate of metal such as a stainless steel in which a plurality of nozzles 31 has been drilled in the shape of row with a pitch (180 dpi, for example) that corresponds to a dot formation density. The nozzle plate 25 of the embodiment is provided with nozzle rows that the nozzles 31 are installed in rows and one nozzle row is composed by 180 nozzles 31, for example.

The above vibrating plate 26 is a double structure formed by laminating an elastic body film 33 on the surface of a supporting plate 32. In the embodiment, the vibrating plate 26 is fabricated using a composite plate that laminates as the supporting plate 32 the stainless steel plate which is a kind of metal plate and as an elastic body film 33 the resin film on the surface of the supporting plate 32. The vibrating plate 26 is provided with a diaphragm unit 34 to change the volume of the pressure chamber 29. In addition, this vibration plate 26 is provided with a compliance unit 35 for sealing a portion of the reservoir 27.

The diaphragm unit 34 is produced by partially removing the supporting plate 32 of the region facing the pressure chamber 29 by etching process and the like. In other words, the diaphragm unit 34 is constituted with an island portion 36 that a distal end face of free ends (the end of opposite side to the side fixed to the fixed plate 22) of the piezoelectric vibrator 20 is joined, and a thin body elastic portion that surrounds the island portion 36. The compliance section 35 is produced by removing a supporting plate 32 of the area opposite to the opened surface of the reservoir 27 by etching process and the like in similar to a diaphragm unit 34 and acts as a damper to absorb the pressure change of ink having been accumulated in the reservoir 27.

Then, in the island section 36, because the distal end face of the piezoelectric vibrator 20 is jointed, it is possible to change the volume of the pressure chamber 29 by extending and retracting the free end of the piezoelectric vibrator 20. The pressure change in the ink in the pressure chamber 29 causes the variation of this volume. Then, the recording head 2 is constituted so that ink droplets are ejected from the nozzles 31 using this pressure change.

Figure 3:
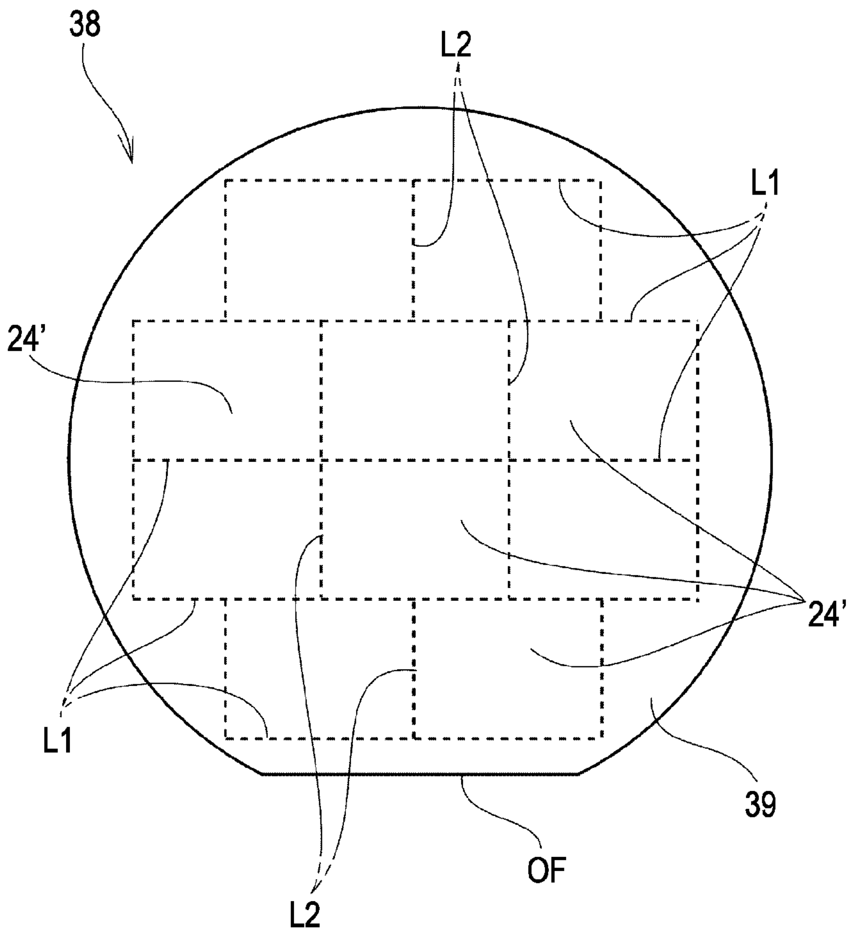
FIG. 3 is a plan view of a silicon wafer made of a material of a passage forming substrate.

Next, a description of the silicon wafer 38 which becomes a material of the passage forming substrate 24 described above will be described. FIG. 3 shows a plan view of the silicon wafer 38. This silicon wafer 38 is a silicon single crystalline substrate that a surface 39 is set to crystal orientation surface (110) face and a thickness is set to the thickness of the passage forming substrate 24 (for example, 400 μm). On the surface 39 of the silicon wafer 38, the substrate region 24' which becomes the passage forming substrate 24 is divided (10 locations in the embodiment) and the portion (such as reservoir 27 and the pressure chamber 29) which becomes the ink passage in each area is formed by etching. In addition, a small elongated through hole 40 (see FIG. 4, etc.) that passes through in the thickness direction on a transverse scheduled cutting line L1 (corresponding to the line to be cut in the invention) is multiple drilled by etching, and also a plurality of through holes 40 are formed on the vertical scheduled cutting line L2 to be cut perpendicular to the transverse scheduled cutting line L1 to be cut and thereby, the break pattern is formed. The transverse scheduled cutting line L1 of the embodiment is on the (110) face and is set in the surface direction of the first (111) face 42 perpendicular to this (110) face. In addition, the vertical scheduled cutting line L2 of longitudinal direction is set in the axial direction perpendicular to the first (111) face 42. In addition, the first (111) face 42 (42') becomes a surface parallel to the orientation flat (so-called orientation flat) OF which becomes a reference surface in the etching process.

Figure 4A:
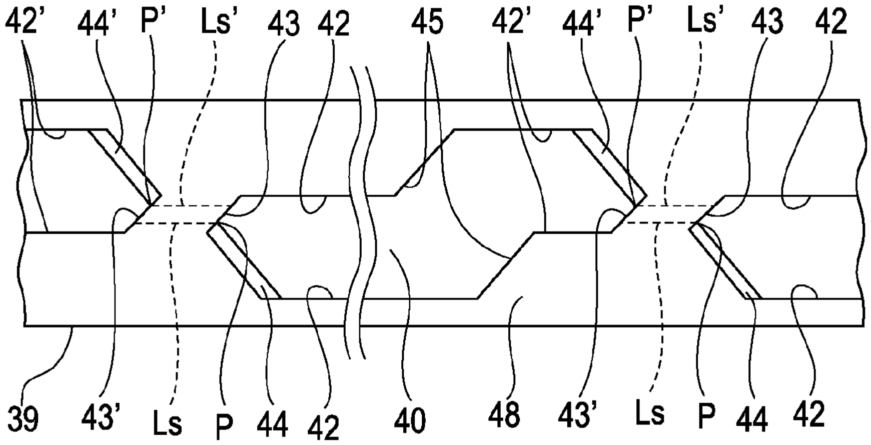
Figure 4B:
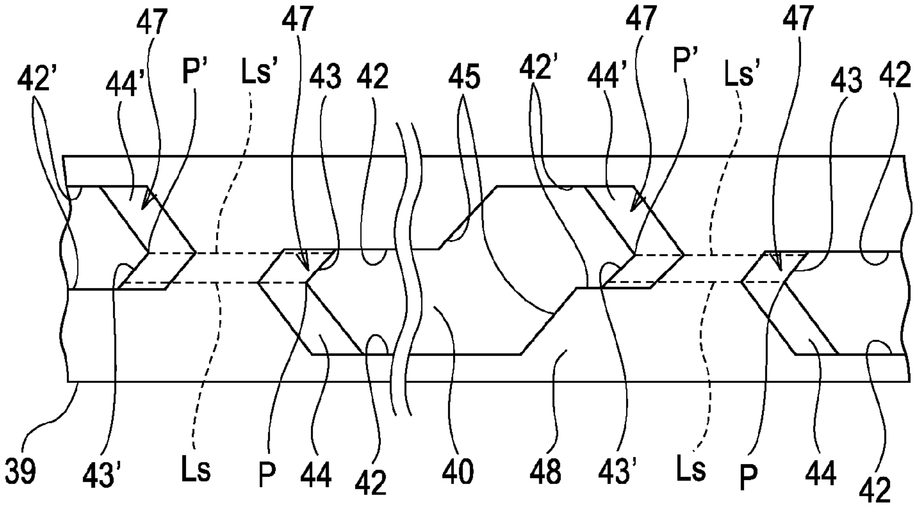

FIGS. 4A and 4B show diagrams illustrating the configuration of a break pattern that is formed on the transverse scheduled cutting line L1 in the silicon wafer 38. FIG. 4A shows an enlarged view of a portion of the break pattern in a state that an etching time is relatively long (or progress of the etching is relatively fast) and residual portion 47 is almost lost. FIG. 4B shows an enlarged view of a portion of the break pattern in a state that the etching time is relatively short (or the progress of etching is relatively short) and a residual portion 47 is left. The through hole 40 when etching time is long as shown in FIG. 4A is a polygonal hole which is formed by a first (111) face 42, a second (111) face 43 intersecting diagonally the first (111) face 42 and is perpendicular to a (110) face, and a third (111) face 44 intersecting to the second (111) face 43 and the first (111) face 42 and is inclined with respect to the (110) face. In addition, the second (111) face 43 intersects at an angle of about 110 degrees on the (110) face (surface 39) with respect to the first (111) face 42. In addition, the third (111) face 44 is a surface inclined at an angle of about 30 degrees with respect to the surface 39 (see FIG. 6).

Now, the shape of the through holes 40 is explained in more detail. The first (111) face 42 succeeding to the second (111) face 43 of one side (middle-left side in FIG. 4A) extends only a predetermined length toward the opposite side of the second (111) face 43 and is contiguous to the connecting surface 45 which is the second (111) face. The connecting surface 45 extends toward the opposite side of the first (111) face 42 succeeding to the third (111) face 44 of one side and is contiguous to the first (111) face 42' succeeding to the third (111) face 44' of the other side (middle-right side in FIG. 4A). In addition, the first (111) face 42 succeeding to the third (111) face 44 of one side extends only a predetermined length toward the opposite side to the third (111) face 44 and is contiguous to the second (111) face relative to the connecting surface 45 described above. This connecting surface 45 is parallel to the connecting surface 45 relative thereto and is aligned in length and is the first (111) face 42' succeeding to the second (111) face 43' of the other side. In other words, the through hole 40 is formed in an elongated long hole (more specifically, a decagonal long hole that is offset from the middle in the width direction of the hexagonal long hole) which is surrounded with the first (111) faces 42 and 42', the second (111) faces 43 and 43', the connecting surface 45, and the third (111) faces 44 and 44'.

Then, the intersecting point P between the second (111) face 43 and the third (111) face 44 is set as the point closest to the adjacent through hole 40 and the first (111) face 42 (42'), that is, a position of an intersecting point P in the direction perpendicular to the orientation flat is set between the first (111) face 42' relative to a side close to the intersecting point P of the adjacent through hole 40. In the embodiment, as shown in FIG. 4A, a position of the intersecting point P in the direction perpendicular to the first (111) face 42 (42') is set between an intersecting point P' of the end edges of the second (111) face 43' and the third (111) face 44' of the adjacent through holes 40 and the first (111) face 42' succeeding to the second (111) face 43'. In other words, the intersecting point P is opposed to the second (111) face 43' of the side closed to the intersecting point of the adjacent through holes 40. In other words, on an imaginary line Ls along the transversely scheduled cutting line L1 from this intersecting point P, the second (111) face 43' is positioned. On the other hand, on an imaginary line Ls' along the transversely scheduled cutting line L1 to be cut from the intersecting point P' of the adjacent through holes 40, the second (111) face 43 is positioned. Then, cutting is scheduled on either of these two imaginary lines Ls and Ls' or between them. It should be noted that, in the embodiment, by etching (so-called half etching) the periphery of the break pattern until halfway through the thickness direction of the silicon wafer 38, a thin body portion 48 that is thinner than other portion is provided. Thereby, cutting can be made more stably. The method for the cutting will be described later.

On the other hand, when etching time is shorter than the case of FIG. 4A, as shown in FIG. 4B, residual portions 47 that are left without being etched into both ends of the longitudinal direction of the inner side is formed in the through hole 40. In other words, instead that the second (111) face 43 and the third (111) face 44 are etched by a predetermined position (opened edge of through holes 40), a penetration portion of the through holes 40 is formed on the inside than expectation. However, since both of the second (111) face 43 and the third (111) face 44 are formed on the inside than expectation, a position of the intersecting point P in the direction perpendicular to the first (111) faces 42 (42') does not change in size compared to a position of the intersecting point P of the through hole 40 when etching time is long. For this reason, in the through holes 40 adjacent to each other, the second (111) face 43 and the second (111) face 43' of adjacent through hole 40 is positioned on imaginary lines Ls and Ls' along the transversely scheduled cutting line L1 to be cut from intersecting points P and P' to each other and on the other hand, cutting can be planned in either one of these imaginary lines Ls and Ls' or between them.

Then, the formation process of the break pattern described above is explained.

Figure 5A:
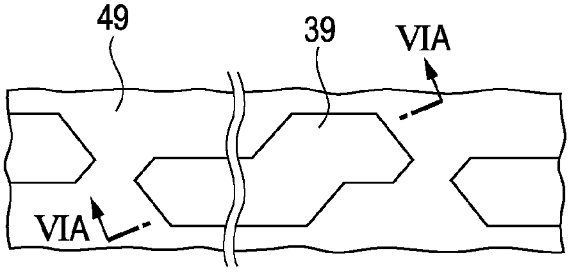
FIGS. 5A to 5E are state transition diagrams illustrating a formation process of through holes in the break pattern.
Figure 5B:
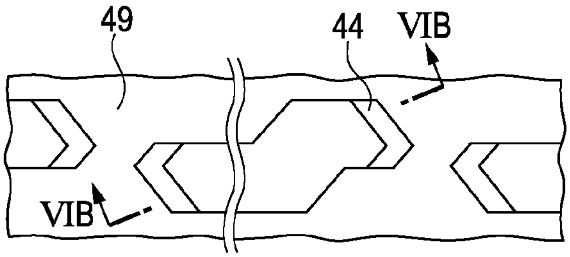
Figure 5C:
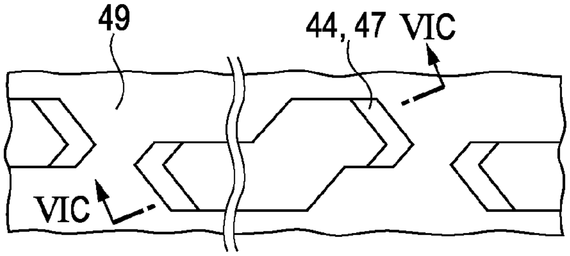
Figure 5D:
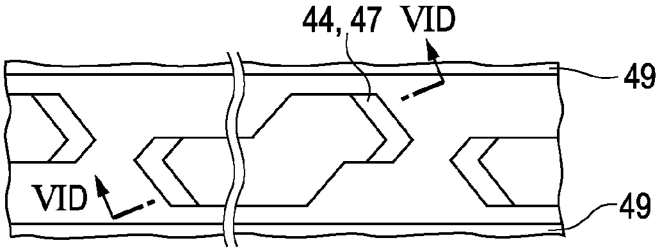
Figure 5E:
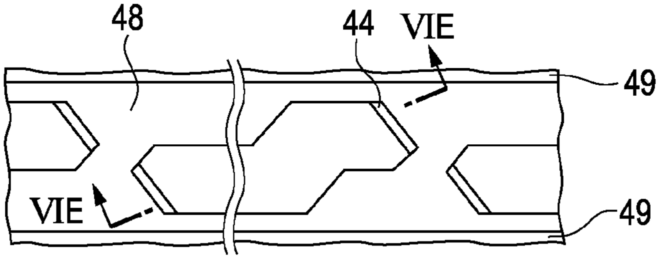
Figure 6A:
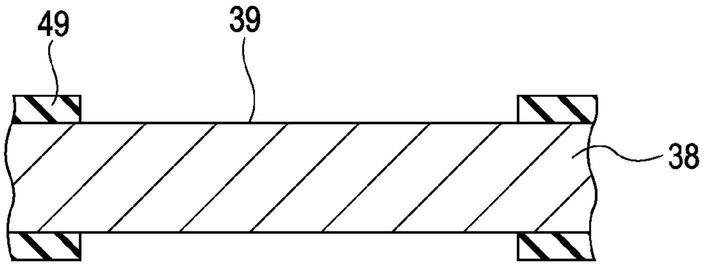
FIGS. 6A to 6E are cross-sectional views taken along line VI-VI in each state of FIGS. 5A to 5E.

FIGS. 5A to 5E show state transition diagrams for explaining the process for formation of the through holes 40 in the break pattern of FIGS. 4A and 4B, and FIGS. 6A to 6E show cross-sectional views of line VI-VI in each state of FIGS. 5A to 5E. In order to prepare a break pattern mentioned above, first, a silicon oxide film (SiO2) 49 (below, simply referred to as an oxide film 49) having about 1 μm to 2 μm of thickness on the surface 39 (the surface (110) of front and back sides) of the silicon wafer 38, by thermal oxidation process. A method for forming the oxide film 49 is not limited to such example, and other methods, for example, such as a CVD (chemical vapor deposition), an ion implantation and the like may also be employed. Further, the silicon oxide film is not limited and may be formed with a so-called n-type silicon film to which boron or gallium atoms are added, or arsenic and antimony atoms are added. Thereafter, as a resin resist, a resist pattern to which the portion corresponding to the through hole 40 is opened is provided, and by removing the oxide film 49 exposed to the opening with an etching solution such as an aqueous solution of hydrofluoric acid (so-called hydrofluoric acid), as shown in FIG. 5A and FIG. 6A, a mask pattern for etching is formed.

Figure 6B:
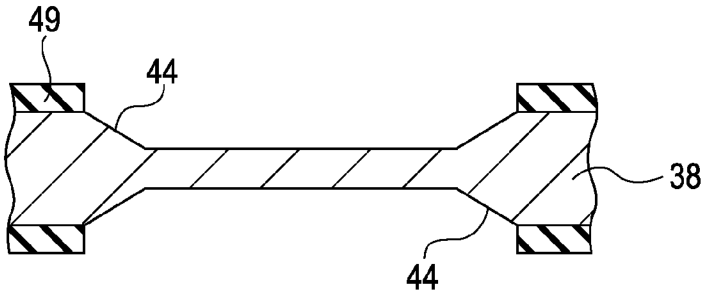
Figure 6C:
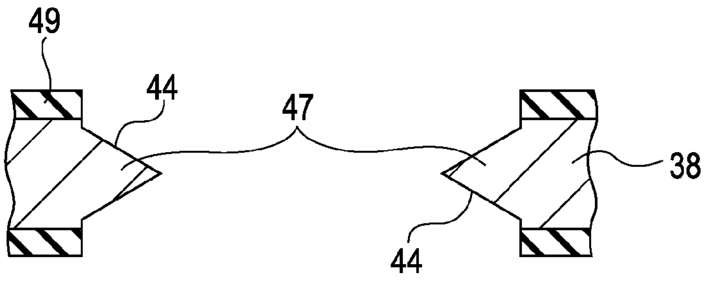

If the mask pattern was formed by the oxide film 49, for example, using the etching solution composed from an aqueous solution of potassium hydroxide (KOH) that is adjusted to 78° C. temperature and a concentration of 20 wt %, the surface 39 of the silicon wafer 38 (front and back of the (110) face) is anisotropically etched (first etching process). When the this first etching process starts, as shown in FIG. 5B and FIG. 6B, the third (111) face 44 inclined at an angle of about 30 degrees with respect to the surface 39 ((110) face) appears. An erosion of the etching continues to progress at the same time from the front and back in a direction perpendicular to this third (111) face 44 and after a few moments, penetrates the thickness direction of the silicon wafer 38 (FIG. 5C and FIG. 6C). At this time, the second (111) face 43 and the third (111) face 44 are formed as a residual portion 47 with not being etched until a predetermined position (opening edge of the mask pattern). In addition, it should be noted that in the embodiment, the first etching process is carried out during 160 to 180 minutes.

Figure 6D:
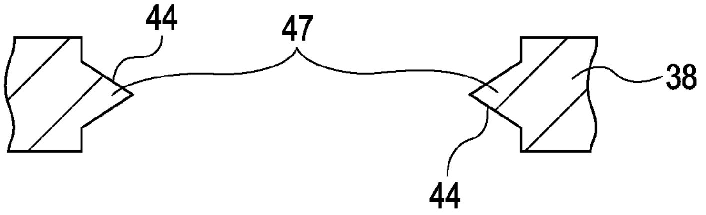

Next, the thin body portion 48 around the through hole 40 is formed concurrently with the formation of the through holes 40. Therefore, as shown in FIG. 5D and FIG. 6D, after removal of the oxide film 49 of the portion that forms a thin body portion 48, further etching is proceed (second etching process). This residual portion 47 is cut gradually and the second (111) face 43 and the third (111) face 44 approach to a predetermined position. In this case, since both of the second (111) face 43 and the third (111) face 44 are cut, the position of the intersecting point P in the direction perpendicular to the first (111) face 42 does not change significantly. Incidentally, in this second etching process, for example, 78° C. temperature and an aqueous solution of potassium hydroxide which is adjusted to 37 wt % concentration is used. In addition, in the thin body portion 48, the depth from surface 39 is set around about 80 μm.

Figure 6E:
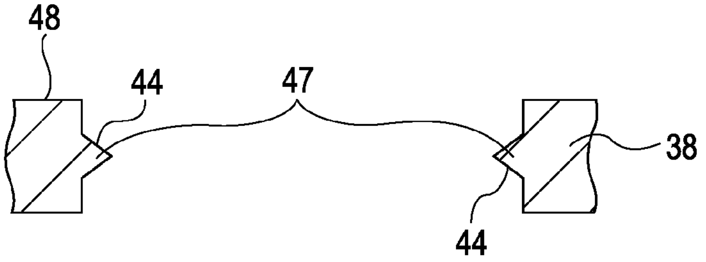

Then, if the etching is progressed until the second (111) face 43 reach a predetermined position, as shown in FIG. 5E and FIG. 6E, the erosion stops in a state that end edges of the third (111) face 44 is formed. In addition, the etching time of the second etching process is managed by workmanship (for example, dimensions of the pressure chamber 29 at a predetermined position) of the substrate region 24' which is made of the passage forming substrate 24. In other words, even in a state that the residual portion 47 is left in the through holes 40, the dimensions of the pressure chamber 29, and the like of the substrate region 24' becomes a predetermined size, and the etching is terminated. Due to variations of etching, the size of the residual portion 47 becomes change. For example, if the progress of the etching is fast (if the etching time is long), the through hole 40 becomes a state shown in FIG. 4A and the like. On the other hand, if the progress of the etching is slow (if the etching time is short), the through hole 40 becomes a state shown in FIG. 4B and the like.

Figure 7A:
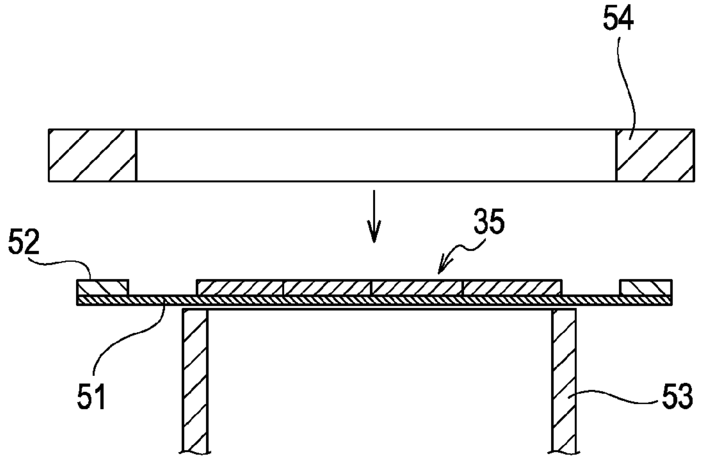
FIGS. 7A and 7B are schematic diagrams for explaining an expanding break process.
Figure 7B:
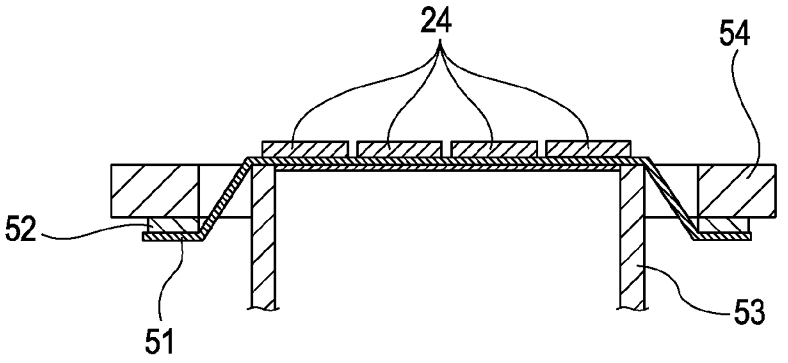
Figure 8A:
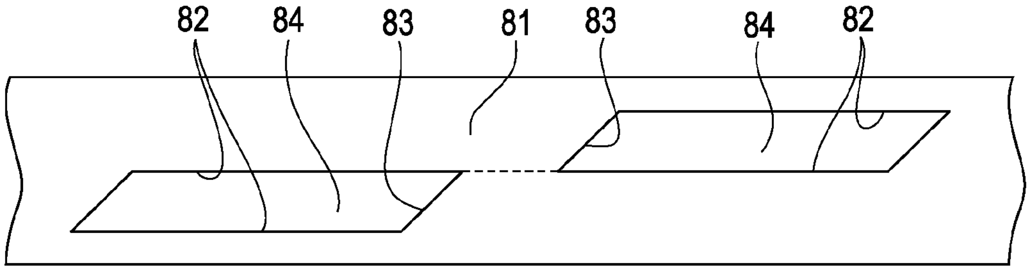
Figure 8B:
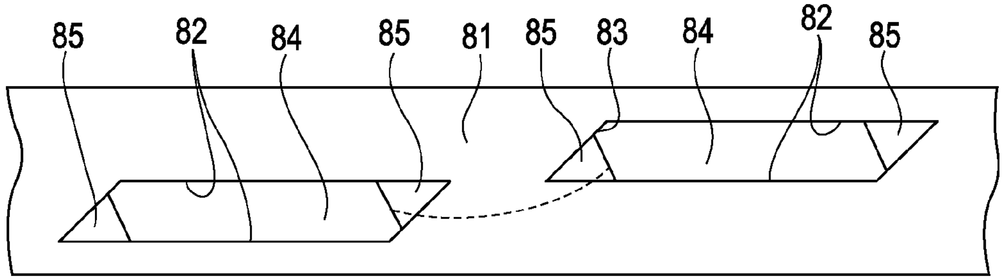

Next, how the silicon wafer 38 which passed through the processes mentioned above is cut into the individual portions (the passage forming substrate 24 corresponds to a silicon substrate in the invention) is explained. In this embodiment, the silicon wafer 38 is cut by the expanding break and splits into individual parts (the passage forming substrate 24) (expanding break process). FIGS. 7A and 7B show schematic diagrams to explain a process of this expanding break. In the process of the expanding break, first, a sheet member 51 (dicing tape) having extensibility is adhered to on the surface of the silicon wafer 38 that the break pattern is formed. On the periphery of the sheet member 51, a wheel shaped-retaining ring 52 that the inner diameter is set greater (for example, 180 mm) than an outer diameter (for example, 150 mm) of the silicon wafer 38 is attached.

Then, the silicon wafer 38 of a state to which the sheet member 51 is adhered, as shown in FIG. 7A, is placed on the top of the table 53 and the expanding ring 54 that an inner diameter is aligned with the retaining ring 52 is disposed. When the expanding ring 54 is lowered down in this state, the expanding ring 54 comes into contact with the retaining ring 52. Thereafter, when the expanding ring 54 is lowered down, according to this, as shown in FIG. 7B, the sheet member 51 is stretched and the silicon wafer 38 is pulled in radial from the center. As a result, the silicon wafer 38 is disconnected in the break pattern and is divided into individual passage forming substrate 24.

As above, according to the break pattern of the silicon wafer 38 of the invention, since the through holes 40 adjacent to each other on an imaginary line Ls along the transversely scheduled cutting line L1 to be cut from the intersecting point P between end edges of the second (111) face 43 and the third (111) face 44 are arranged, cutting along the transversely scheduled cutting line L1 can be made. Also, even though the etching varies, since the position of the intersecting point P in the direction perpendicular to the first (111) face 42 is difficult to change, cutting along the transversely scheduled cutting line L1 can be made stably. In other words, problems such as being disconnected at the unintended position can be prevented. In addition, in this embodiment, since the intersecting point P is opposed to the second (111) face 43 of the side closing to the intersecting point P of the adjacent through holes 40, a position of the transverse scheduled cutting line L1 can narrow in a position passing through the second (111)

face 43 and cutting can be made more accurately. Thus, it is possible to be cut the substrate more stably.

By the way, the invention is not limited to the embodiments described above, and various modifications may be made on the basis of the description of the scope of the appended claims. For example, the shape of the through hole is not limited to those exampled above and any length in the longitudinal direction of the through hole, the position of the intersecting point or the like can be determined optionally. In addition, a case of producing a passage forming substrate of the recording head using a silicon wafer has been described in the above, but the invention is not limited to this, and can be applied, for example, in the case of manufacturing a semiconductor device and the like using a silicon wafer.

Further, if it is a liquid ejecting head of a liquid ejecting apparatus that liquid ejecting control is possible by using pressure generating means, the invention is not limited to a printer, and may be applied to the liquid ejecting head which is used in a plotter, a facsimile machine, a copy machine and the like, various types of ink jet recording apparatus, and a liquid ejecting system other than the recording device, for example, a display manufacturing equipment, an electrode manufacturing equipment, a chip manufacturing equipment. Thus, in the display manufacturing equipment, a solution of the material of each of color R (Red), G (Green) and B (Blue) is ejected from a color material ejecting head. In addition, the electrode manufacturing equipment, a liquefied electrode material is ejected from the electrode material ejecting head. In the chip manufacturing equipment, a solution of biological organic matter is injected from biological organic matter ejecting head.

The entire disclosure of Japanese Patent Application No. 2011-176522, filed Aug. 12, 2011 is incorporated by reference herein.

What is claimed is:

1. A break pattern of a silicon wafer, comprising:

a line to be cut which is set on a (110) face in the silicon wafer assuming a surface as the (110) face in a surface direction of a first (111) face perpendicular to the (110) face; and through holes which are penetrated in the thickness direction of the silicon wafer and are provided in a plurality of rows on the line to be cut, wherein each of the through holes has a first (111) face, a second (111) face which intersects the first (111) face and is perpendicular to the (110) face, and a third (111) face which intersects the second (111) face and the first (111) face and is slanted with respect to the (110) face, an intersecting point with end edges of the second (111) face and the third (111) face is assumed as a point closest to the adjacent through holes, and a position of the intersecting point in a direction perpendicular to the first (111) face is set between the first (111) face and another first (111) face relative to a side close to the intersecting point of the adjacent through holes.

2. The break pattern of a silicon wafer according to claim 1, wherein the intersecting point is opposed to the second (111) face of a side close to the intersecting point of the adjacent through holes.

3. A silicon wafer comprising:

the break pattern formed according to the claim 1.

4. A silicon wafer comprising:

the break pattern formed according to the claim 2.

5. A silicon substrate comprising:

the break pattern according to claim 1 which is formed on the silicon wafer by etching, wherein the silicon wafer is cut in the break pattern by an expanding break which radially pulls and expands from the center of the silicon wafer.

6. A silicon substrate comprising:

the break pattern according to claim 2 which is formed on the silicon wafer by etching, wherein the silicon wafer is cut in the break pattern by an expanding break which radially pulls and expands from the center of the silicon wafer.

* * * * *